United States Patent
Sakai et al.

(10) Patent No.: US 9,607,905 B2
(45) Date of Patent: Mar. 28, 2017

(54) METHOD OF MEASURING BREAKDOWN VOLTAGE OF SEMICONDUCTOR ELEMENT AND METHOD OF MANUFACTURING SEMICONDUCTOR ELEMENT

(71) Applicant: Sumitomo Electric Industries, Ltd., Osaka-shi (JP)

(72) Inventors: Mitsuhiko Sakai, Osaka (JP); Susumu Yoshimoto, Itami (JP)

(73) Assignee: Sumitomo Electric Industries, Ltd., Osaka-shi (JP)

( * ) Notice: Subject to any disclaimer, the term of this patent is extended or adjusted under 35 U.S.C. 154(b) by 0 days.

(21) Appl. No.: 14/843,058

(22) Filed: Sep. 2, 2015

(65) Prior Publication Data

US 2016/0064292 A1    Mar. 3, 2016

(30) Foreign Application Priority Data

Sep. 3, 2014    (JP) .................................. 2014-179004

(51) Int. Cl.
*H01L 21/66* (2006.01)
*G01R 31/26* (2014.01)
*H01L 21/78* (2006.01)

(52) U.S. Cl.
CPC .............. *H01L 22/14* (2013.01); *H01L 21/78* (2013.01)

(58) Field of Classification Search
CPC    G01R 1/0491; G01R 31/261; G01R 31/2623; H01L 21/76814; H01L 21/76883; H01L 22/14; H01L 22/34; H01L 29/66068
See application file for complete search history.

(56) References Cited

U.S. PATENT DOCUMENTS

2004/0137752 A1*    7/2004    Sugamoto ............... H01L 22/24
                                                         438/745

FOREIGN PATENT DOCUMENTS

JP        2003/100819 A        4/2003
WO    WO-2010/021070 A1    2/2010

OTHER PUBLICATIONS

English translation of WO 2010/021070 priority document.*

* cited by examiner

*Primary Examiner* — Pamela E Perkins
(74) *Attorney, Agent, or Firm* — Venable LLP; Michael A. Sartori; F. Brock Riggs

(57) ABSTRACT

A method of measuring a breakdown voltage of a semiconductor element includes the steps below. A wafer provided with a plurality of semiconductor elements each having an electrode is prepared. The wafer is divided into a plurality of chips provided with at least one semiconductor element. After the step of division into the plurality of chips, a breakdown voltage of the semiconductor element is measured while a probe is in contact with the electrode of the semiconductor element in an insulating liquid.

10 Claims, 5 Drawing Sheets

METHOD OF MEASURING BREAKDOWN VOLTAGE OF SEMICONDUCTOR ELEMENT AND METHOD OF MANUFACTURING SEMICONDUCTOR ELEMENT

BACKGROUND OF THE INVENTION

Field of the Invention

The present invention relates to a method of measuring a breakdown voltage of a semiconductor element and a method of manufacturing a semiconductor element, and particularly to a method of measuring a breakdown voltage of a semiconductor element with the use of an insulating liquid and a method of manufacturing a semiconductor element.

Description of the Background Art

In order to allow a semiconductor device to be high in breakdown voltage and low in loss and to be used in a high-temperature environment, silicon carbide has recently increasingly been adopted as a material forming a semiconductor device. Silicon carbide is a wide band gap semiconductor greater in band gap than silicon which has conventionally widely been used as a material forming a semiconductor device. Therefore, by adopting silicon carbide as a material forming a semiconductor device, a higher breakdown voltage of a semiconductor device can be achieved. Since a silicon carbide semiconductor device is high in breakdown voltage, a breakdown voltage of a silicon carbide semiconductor device may be measured with the use of an insulating liquid.

For example, Japanese Patent Laying-Open No. 2003-100819 discloses a method of examining a breakdown voltage of a device high in breakdown voltage. According to the method of examining a breakdown voltage, a breakdown voltage of the device high in breakdown voltage is measured while a wafer arranged on a stage is immersed in an insulating solution together with the stage. By immersing the wafer in the insulating solution, occurrence of atmospheric discharge can be suppressed even when a high voltage is applied to a device high in breakdown voltage.

International publication WO2010/021070 discloses a method of measuring a breakdown voltage of a metal oxide semiconductor field effect transistor (MOSFET). According to the method of measuring a breakdown voltage, initially, an insulating liquid is dropped onto a surface of a wafer so as to cover a source electrode pad and a gate electrode pad. Then, a breakdown voltage of the MOSFET is measured by bringing a probe in contact with the source electrode pad and the gate electrode pad in the insulating liquid. By using the insulating liquid, discharging from the probe can be suppressed even when a high voltage is applied to the source electrode pad.

SUMMARY OF THE INVENTION

According to the methods described in Japanese Patent Laying-Open No. 2003-100819 and International publication WO2010/021070, however, a breakdown voltage is measured in a state of wafer. When the wafer is diced into chips after measurement of a breakdown voltage, the breakdown voltage may degrade due to damage to the chips. Therefore, when a breakdown voltage is measured in the state of wafer, a breakdown voltage in a state of chip close to a final product has not successfully accurately been measured. An object of one manner of the present invention is to accurately measure a breakdown voltage of a semiconductor element.

A method of measuring a breakdown voltage of a semiconductor element according to one manner of the present invention includes the steps below. A wafer provided with a plurality of semiconductor elements each having an electrode is prepared. The wafer is divided into a plurality of chips provided with at least one semiconductor element. After the step of division into the plurality of chips, a breakdown voltage of a semiconductor element is measured while a probe is in contact with the electrode of the semiconductor element in an insulating liquid.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
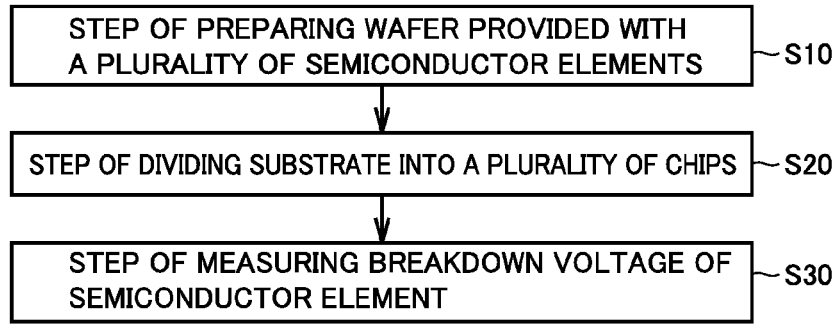
FIG. 1 is a flowchart schematically showing a method of measuring a breakdown voltage of a semiconductor element and a method of manufacturing a semiconductor element according to one embodiment of the present invention.

[Description of Embodiments of the Present Invention]

Embodiments of the present invention will initially be listed and described.

(1) A method of measuring a breakdown voltage of a semiconductor element 1c according to one manner of the present invention includes the steps below. A wafer 1 provided with a plurality of semiconductor elements 1c each having an electrode 16 is prepared. Wafer 1 is divided into a plurality of chips 2 provided with at least one semiconductor element 1c. After the step of dividing wafer 1 into the plurality of chips 2, a breakdown voltage of semiconductor layer 1c is measured while a probe 5b is in contact with electrode 16 of semiconductor element 1c in an insulating liquid 4.

A breakdown voltage of semiconductor element 1c is normally measured in a state of wafer 1. When wafer 1 is divided into chips 2, however, chip 2 may be damaged. In this case, even though semiconductor element 1c has a high breakdown voltage in the state of wafer 1, a breakdown voltage of semiconductor element 1c is lower in a state of chip 2 close to a final product. Namely, a breakdown voltage of semiconductor element 1c measured in the state of wafer 1 may not correctly reflect a breakdown voltage of semiconductor element 1c in the state of chip 2 close to the final product. Even when chip 2 has not been damaged, a breakdown voltage of semiconductor element 1c measured in the state of wafer 1 is not equal to a breakdown voltage of semiconductor element 1c measured in the state of chip 2. Therefore, the breakdown voltage of semiconductor element 1c measured in the state of wafer 1 does not correctly reflect the breakdown voltage measured in the state of chip 2 close to the final product.

According to the method of measuring a breakdown voltage of semiconductor element 1c in (1), after wafer 1 is divided into a plurality of chips 2, a breakdown voltage of semiconductor element 1c is measured while probe 5b is in contact with electrode 16 of semiconductor element 1c in insulating liquid 4. Therefore, a breakdown voltage of semiconductor element 1c in the state of chip 2 close to the final product can accurately be measured.

(2) In the method of measuring a breakdown voltage of semiconductor element 1c according to (1), preferably, the step of measuring a breakdown voltage of semiconductor element 1c includes the step of arranging chip 2 on a surface 3a of a stage 3. In the step of measuring a breakdown voltage of semiconductor element 1c, a breakdown voltage of semiconductor element 1c is measured while insulating liquid 4 is arranged to cover the entire chip 2 on surface 3a. Thus, occurrence of atmospheric discharge in probe 5b can effectively be prevented.

(3) In the method of measuring a breakdown voltage of semiconductor element 1c according to (2), preferably, on surface 3a of stage 3, when viewed in a direction perpendicular to surface 3a, a sidewall 8 is provided to surround chip 2. Insulating liquid 4 is arranged in a space 8a formed by surface 3a and sidewall 8. In the step of measuring a breakdown voltage of semiconductor element 1c, a breakdown voltage of semiconductor element 1c is measured while the entire chip 2 is immersed in insulating liquid 4 in space 8a. Thus, since an amount of insulating liquid 4 is maintained constant, reproducibility of a result of measurement of a breakdown voltage of semiconductor element 1c is improved.

(4) In the method of measuring a breakdown voltage of semiconductor element 1c according to (2) or (3), preferably, surface 3a of stage 3 has arithmetic mean roughness not greater than 2.0 μm. Thus, a desired height of insulating liquid 4 from an upper surface of chip 2 can be held.

(5) In the method of measuring a breakdown voltage of semiconductor element 1c according to any of (2) to (4), preferably, when viewed in a direction in parallel to surface 3a of stage 3, an angle of contact θ formed between surface 3a of stage 3 and an outer surface 4a of insulating liquid 4 is not smaller than 90°. Thus, a breakdown voltage of semiconductor element 1c can be measured with an amount of insulating liquid smaller than in a case that angle of contact θ is smaller than 90°.

(6) The method of measuring a breakdown voltage of semiconductor element 1c according to any of (1) to (5) preferably further includes the step of removing insulating liquid 4 after the step of measuring a breakdown voltage of semiconductor element 1c. When chip 2 is immersed in insulating liquid 4, it becomes difficult to handle chip 2 after a breakdown voltage of semiconductor element 1c is measured. With the step of removing insulating liquid 4 after the step of measuring a breakdown voltage of semiconductor element 1c, handling of chip 2 can be facilitated.

(7) In the method of measuring a breakdown voltage of semiconductor element 1c according to (6), preferably, the step of removing insulating liquid 4 includes the step of heating insulating liquid 4 to a temperature not lower than a boiling point of insulating liquid 4. Thus, insulating liquid 4 can effectively be removed.

(8) In the method of measuring a breakdown voltage of semiconductor element 1c according to (6) or (7), preferably, the step of removing insulating liquid 4 includes the step of spraying an inert gas to insulating liquid 4. Thus, insulating liquid 4 can effectively be removed.

(9) In the method of measuring a breakdown voltage of semiconductor element 1c according to any of (1) to (8), preferably, a portion of insulating liquid 4 smallest in thickness on an outer surface of chip 2 has a thickness d not smaller than 200 μm. Thus, occurrence of atmospheric discharge in probe 5b can effectively be prevented.

(10) In the method of measuring a breakdown voltage of semiconductor element 1c according to any of (1) to (9), preferably, semiconductor element 1c contains a silicon carbide semiconductor. Semiconductor element 1c containing the silicon carbide semiconductor is higher in breakdown voltage than a semiconductor element containing silicon. The method of measuring a breakdown voltage of semiconductor element 1c according to any of (1) to (9) is more suitably made use of for semiconductor element 1c high in breakdown voltage.

(11) A method of manufacturing semiconductor element 1c according to one manner of the present invention includes the method of measuring a breakdown voltage of semiconductor element 1c according to any of (1) to (10). Thus, a method of manufacturing semiconductor element 1c having the step of measuring a breakdown voltage high in accuracy in measurement of a breakdown voltage of semiconductor element 1c can be provided.

[Details of Embodiments of the Present Invention]

An embodiment of the present invention will be described hereinafter with reference to the drawings. It is noted that, in the drawings below, the same or corresponding elements have the same reference characters allotted and description thereof will not be repeated. In addition, regarding crystallographic denotation herein, an individual orientation, a group orientation, an individual plane, and a group plane are shown in [ ], < >, ( ), and { }, respectively. Moreover, a crystallographically negative index is normally expressed by a number with a bar "-" thereabove, however, a negative sign herein precedes a number.

A method of measuring a breakdown voltage of a semiconductor element and a method of manufacturing a semiconductor element according to one embodiment of the present invention will be described.

Figure 2:
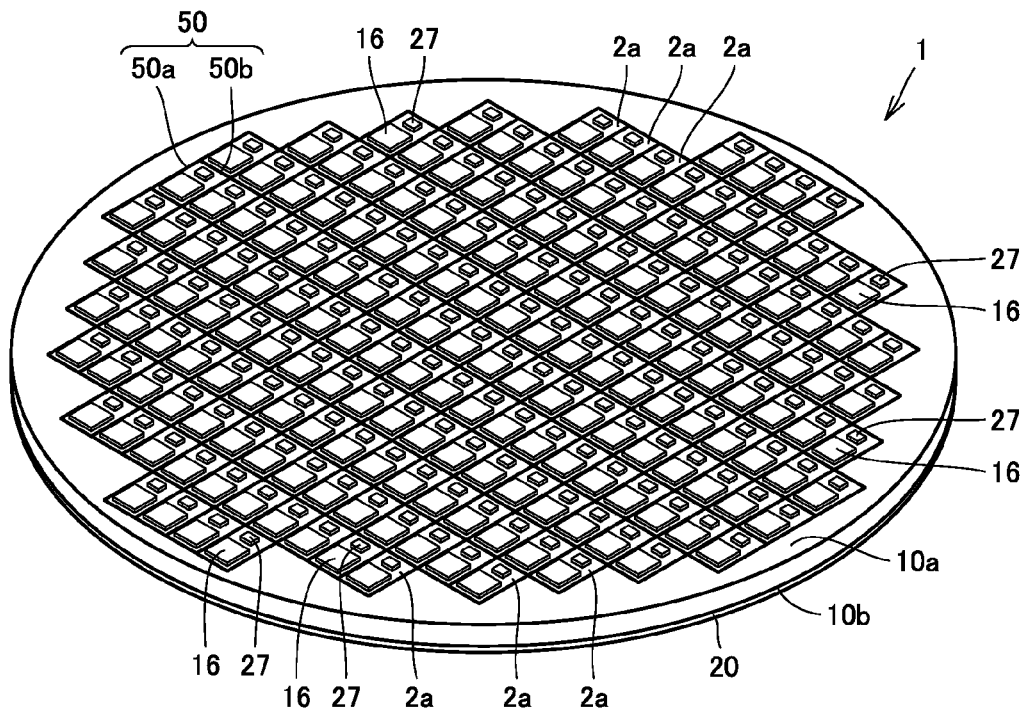
FIG. 2 is a perspective schematic diagram showing a first step in the method of measuring a breakdown voltage of a semiconductor element according to one embodiment of the present invention.

Initially, the step of preparing a wafer provided with a plurality of semiconductor elements (S10: FIG. 1) is performed. Referring to FIG. 2, wafer 1 provided with a plurality of chip regions 2a is prepared. The plurality of chip regions 2a are separated from one another by dicing lines 50. Dicing line 50 includes a first dicing line 50a extending in one specific direction (for example, a direction of <1-100>) and a second dicing line 50b extending in a direction perpendicular to one specific direction (for example, a direction of <11-20>). A source electrode 16 and a gate electrode 27 are exposed on a side of a first main surface 10a of wafer 1. Each of the plurality of chip regions 2a has, for example, one source electrode 16 and one gate electrode 27. A drain electrode 20 is exposed on a side of a second main surface 10b of wafer 1. Drain electrode 20 is provided, for example, to cover the entire second main surface 10b of wafer 1. As will be described later, semiconductor element 1c has, for example, source electrode 16, gate electrode 27, and drain electrode 20. Namely, each of the plurality of chip regions 2a includes at least one semiconductor element 1c. As set forth above, wafer 1 provided with a plurality of semiconductor elements 1c each having source electrode 16, gate electrode 27, and drain electrode 20 is prepared.

A construction of a MOSFET representing one example of semiconductor element 1c will now be described.

Figure 3:
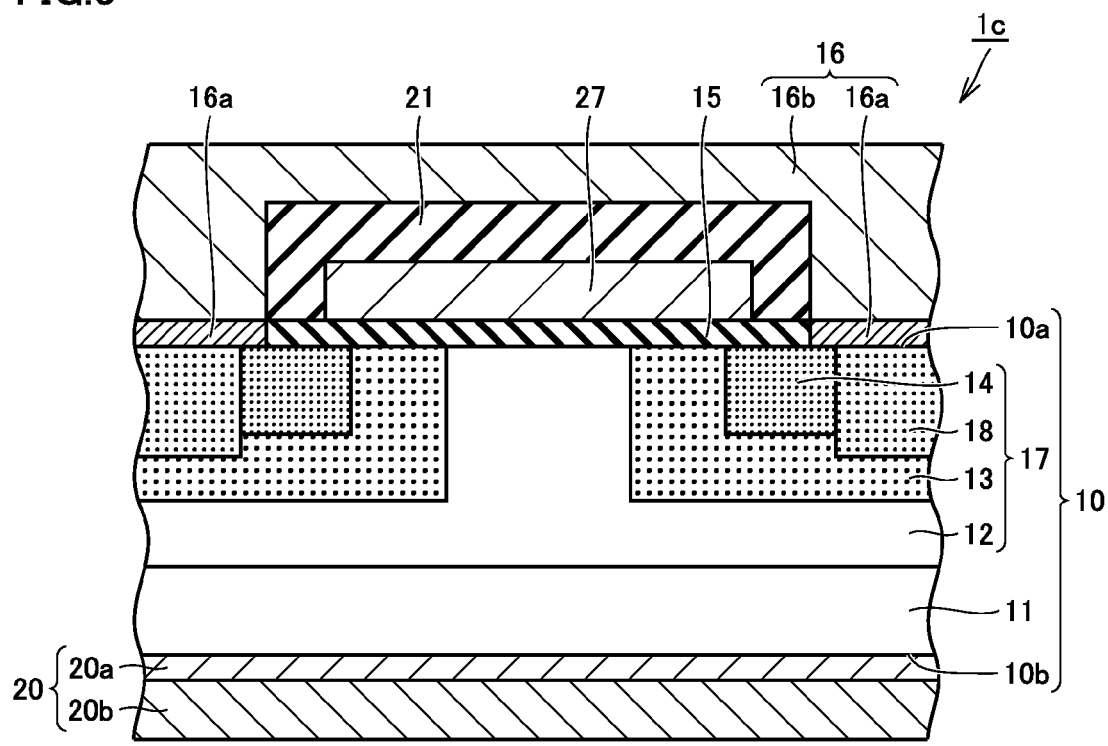
FIG. 3 is a vertical schematic cross-sectional view showing a construction of a semiconductor element according to one embodiment of the present invention.

Referring to FIG. 3, a MOSFET representing one example of semiconductor element 1c is, for example, a vertical semiconductor element, and mainly has a semiconductor layer 10, gate electrode 27, a gate oxide film 15, an interlayer insulating film 21, source electrode 16, and drain electrode 20. Semiconductor layer 10 has first main surface 10a and second main surface 10b opposite to first main surface 10a. Semiconductor layer 10 is formed, for example, from a silicon carbide substrate, and mainly includes a silicon carbide single crystal substrate 11 and a silicon carbide epitaxial layer 17 provided on silicon carbide single crystal substrate 11. Namely, semiconductor element 1c contains a silicon carbide semiconductor.

Silicon carbide single crystal substrate 11 is composed, for example, of hexagonal silicon carbide single crystal having a poly type 4H. First main surface 10a of semiconductor layer 10 has a maximum diameter, for example, not smaller than 100 mm and preferably not smaller than 150 mm. First main surface 10a of semiconductor layer 10 is, for example, a {0001} plane or a surface angled off by at most 4° relative to the {0001} plane. Specifically, first main surface 10a is, for example, a (0001) plane or a surface angled off approximately by at most 4° relative to the (0001) plane, and second main surface 10b is a (000-1) plane or a surface angled off approximately by at most 4° relative to the (000-1) plane. Semiconductor layer 10 has a thickness, for example, not greater than 600 μm and preferably not greater than 300 μm.

Referring to FIG. 3, silicon carbide epitaxial layer 17 has a drift region 12, a body region 13, a source region 14, and a contact region 18. Drift region 12 contains an n-type impurity such as nitrogen and has an n-type (a first conductivity type). A concentration of the n-type impurity in drift region 12 is, for example, $5 \times 10^{15}$ cm$^{-3}$. Body region 13 contains a p-type impurity such as aluminum and has a p-type (a second conductivity type). A concentration of the p-type impurity in body region 13 is, for example, $1 \times 10^{17}$ cm$^{-3}$.

Source region 14 contains an n-type impurity such as phosphorus and has the n-type. Source region 14 is formed as being surrounded by body region 13. Preferably, source region 14 is higher in concentration of the n-type impurity than drift region 12. A concentration of a donor impurity in source region 14 is, for example, $1 \times 10^{20}$ cm$^{-3}$. Source region 14 is spaced apart from drift region 12 by body region 13.

Contact region 18 contains a p-type impurity such as aluminum and has the p-type. A side surface of contact region 18 is provided as being surrounded by source region 14 and a bottom surface of contact region 18 is in contact with body region 13. Preferably, contact region 18 is higher in concentration of the p-type impurity than body region 13. A concentration of the p-type impurity in contact region 18 is, for example, $1 \times 10^{20}$ cm$^{-3}$.

Gate oxide film 15 is formed to be in contact with first main surface 10a of semiconductor layer 10 so as to extend from an upper surface of one source region 14 to an upper surface of the other source region 14. Gate oxide film 15 is in contact with source region 14, body region 13, and drift region 12 at first main surface 10a of semiconductor layer 10. Gate oxide film 15 is composed, for example, of a material containing silicon dioxide. Gate oxide film 15 has a thickness, for example, not smaller than 40 nm and not greater than 60 nm.

Gate electrode 27 is arranged to be in contact with gate oxide film 15 so as to extend from one source region 14 to the other source region 14 over the same. Gate oxide film 15 lies between semiconductor layer 10 and gate electrode 27. Gate electrode 27 is provided to face source region 14, body region 13, and drift region 12. Gate electrode 27 is composed, for example, of polysilicon doped with an impurity or such a conductor as aluminum.

Source electrode 16 has a source electrode portion 16a and a surface protecting electrode 16b. Source electrode portion 16a is in contact with source region 14 and contact region 18 at first main surface 10a of semiconductor layer 10. Source electrode portion 16a contains, for example, TiAlSi. Source electrode portion 16a is in ohmic contact with source region 14. Surface protecting electrode 16b is in direct contact with source electrode portion 16a and provided to cover interlayer insulating film 21. Surface protecting electrode 16b is electrically connected to source region 14 through source electrode 16.

Interlayer insulating film 21 is provided to be in contact with each of gate electrode 27 and gate oxide film 15 so as to cover gate electrode 27. Interlayer insulating film 21 electrically isolates gate electrode 27 and source electrode 16 from each other. Interlayer insulating film 21 is composed, for example, of silicon dioxide.

Drain electrode 20 includes a drain electrode portion 20a and a backside surface protecting electrode 20b. Drain electrode portion 20a is provided to be in contact with second main surface 10b of semiconductor layer 10. Drain electrode portion 20a is composed of a material capable of establishing ohmic contact with n-type silicon carbide single crystal substrate 11, such as NiSi (nickel silicide). Backside surface protecting electrode 20b is electrically connected to drain electrode portion 20a.

Figure 4:
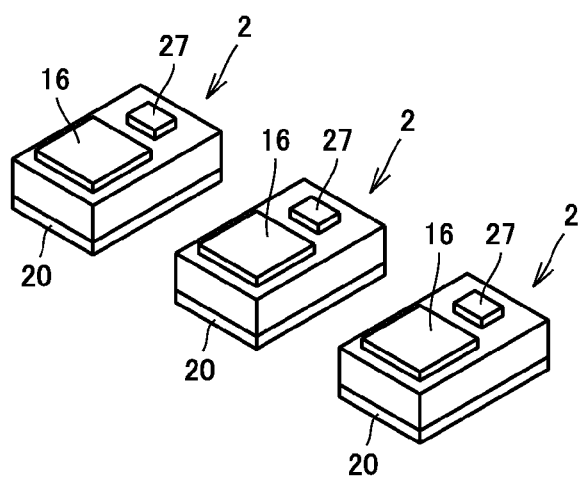
FIG. 4 is a perspective schematic diagram showing a second step in the method of measuring a breakdown voltage of a semiconductor element according to one embodiment of the present invention.

Then, the step of dividing the substrate into a plurality of chips (S20: FIG. 1) is performed. Referring to FIGS. 2 and 4, wafer 1 provided with a plurality of chip regions 2a is divided into a plurality of chips 2 by being cut along dicing lines 50. Each of the plurality of chips 2 is provided with at least one semiconductor element 1c. Each of the plurality of chips 2 has a substantially parallelepiped shape. One surface (first main surface 10a) of chip 2 is provided with source electrode 16 and gate electrode 27, and the other surface (second main surface 10b) is provided with drain electrode 20. As set forth above, wafer 1 is divided into a plurality of chips 2 provided with at least one semiconductor element 1c.

Figure 5:
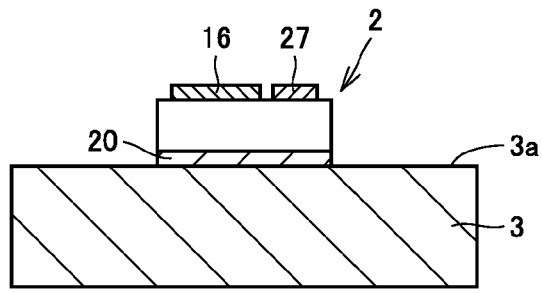
FIG. 5 is a vertical schematic cross-sectional view showing a third step in the method of measuring a breakdown voltage of a semiconductor element according to one embodiment of the present invention.
Figure 7:
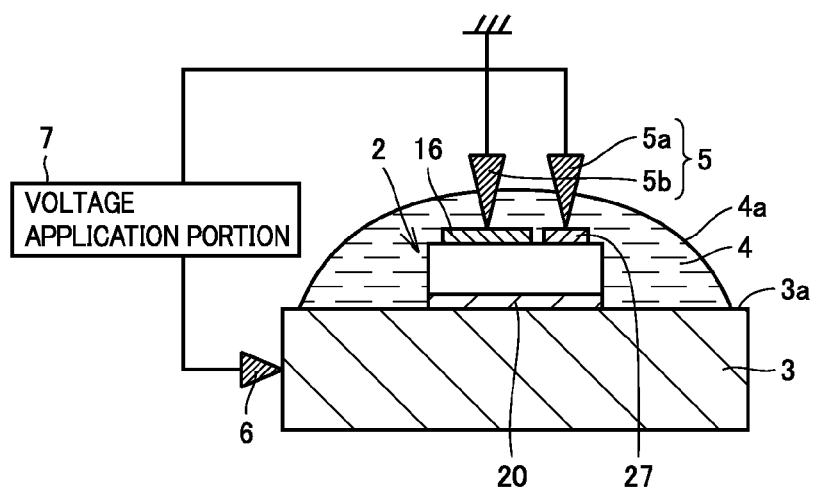
FIG. 7 is a vertical schematic cross-sectional view showing a fifth step in the method of measuring a breakdown voltage of a semiconductor element according to one embodiment of the present invention.

Referring to FIG. 5, chip 2 provided with at least one semiconductor element 1c is arranged on surface 3a of stage 3. Chip 2 is arranged on surface 3a of stage 3 such that drain electrode 20 provided in chip 2 is in contact with surface 3a of stage 3. Stage 3 is composed of a conductive material such as a metal. Examples of a material forming stage 3 include stainless steel, gold (Au), silver (Ag), copper (Cu), and nickel (Ni). Surface 3a of stage 3 may be formed from a plating layer. For example, stage 3 is formed as stainless steel is plated with gold. Preferably, stage 3 has a mechanism (not shown) capable of suctioning chip 2 onto surface 3a of stage 3. A mechanism capable of suctioning chip 2 onto surface 3a of stage 3 is exemplified by an electrostatic chuck mechanism. Preferably, stage 3 has a mechanism (not shown) capable of heating surface 3a of stage 3. As shown in FIG. 7, a third probe 6 is connectable to one end of stage 3. Third probe 6 may be connected to stage 3.

Figure 6:
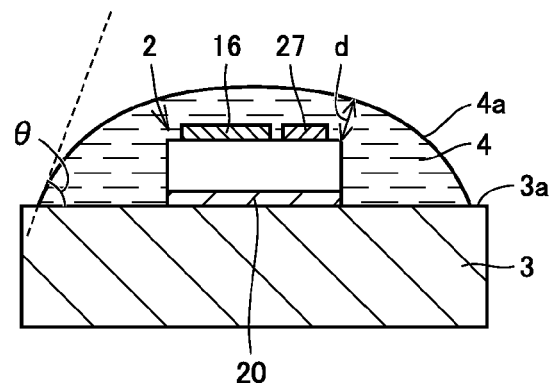
FIG. 6 is a vertical schematic cross-sectional view showing a fourth step in the method of measuring a breakdown voltage of a semiconductor element according to one embodiment of the present invention.

Then, the step of arranging insulating liquid 4 onto chip 2 is performed. Referring to FIG. 6, insulating liquid 4 is applied onto chip 2 so as to cover source electrode 16 and gate electrode 27 provided in chip 2. For example, a fluorine-based inert liquid or more specifically Fluorinert™ FC-72 of Sumitomo 3M Limited is employed as insulating liquid 4. For example, Novec™ 7000 or 7100 of Sumitomo 3M Limited may be employed as insulating liquid 4. Insulating liquid 4 should only cover at least source electrode 16, and does not have to cover the entire chip 2. Preferably, the insulating liquid is arranged to cover the entire chip 2 on surface 3a of stage 3 (see FIG. 6). Namely, insulating liquid 4 is in contact with surface 3a of stage 3, source electrode 16 and gate electrode 27 in chip 2, and a side surface of chip 2. Preferably, a portion of insulating liquid 4 smallest in thickness on the outer surface of chip 2 has a thickness d not smaller than 200 μm and not greater than 1000 μm. Thickness d of the portion of insulating liquid 4 smallest in thickness on the outer surface of chip 2 refers to a shortest distance between outer surface 4a of insulating liquid 4 and the outer surface of chip 2. The outer surface of chip 2 includes the surface of gate electrode 27 and the surface of source electrode 16.

Referring to FIG. 6, when viewed in a direction in parallel to surface 3a of stage 3, angle of contact θ formed between surface 3a of stage 3 and outer surface 4a of insulating liquid 4 may be smaller than 90°. Angle of contact θ formed between surface 3a of stage 3 and outer surface 4a of insulating liquid 4 can be varied by adjusting roughness of surface 3a of stage 3. Angle of contact θ is defined as an angle formed between surface 3a of stage 3 and a tangent of outer surface 4a of insulating liquid 4 at a position of contact of insulating liquid 4 with surface 3a. Angle of contact θ can be measured, for example, with a contact angle meter manufactured by Kyowa Interface Science Co., Ltd. In order to achieve angle of contact θ formed between surface 3a of stage 3 and outer surface 4a of insulating liquid 4 which is smaller than 90°, roughness of surface 3a of stage 3 is desirably less. Preferably, arithmetic mean roughness (Ra) of surface 3a of stage 3 is not greater than 2.0 μm and more preferably not smaller than 0.4 μm and not greater than 1.6 μm. Arithmetic mean roughness (Ra) of surface 3a of stage 3 can be measured, for example, with a surface roughness measuring instrument.

Referring to FIG. 7, a configuration of an apparatus for measuring a breakdown voltage of a semiconductor element will be described. The apparatus for measuring a breakdown voltage of a semiconductor element mainly has a probe 5 and a voltage application portion 7. Probe 5 mainly has a first probe 5a, second probe 5b, and third probe 6. Voltage application portion 7 is provided between first probe 5a and third probe 6. Third probe 6 is electrically connected to conductive stage 3. Voltage application portion 7 is configured to be able to apply a voltage across source electrode 16 and drain electrode 20. A voltage which can be applied across source electrode 16 and drain electrode 20 by voltage application portion 7 is, for example, not lower than 600 V, preferably not lower than 1.8 kV, and more preferably not lower than 3 kV. First probe 5a and second probe 5b are grounded. A gate drive portion (not shown) may be provided between first probe 5a and second probe 5b. The gate drive portion is configured to be able to apply a gate voltage to gate electrode 27.

A method of measuring a breakdown voltage of a semiconductor element will now be described. Referring to FIG. 7, first probe 5a is brought in contact with gate electrode 27 of semiconductor element 1c in insulating liquid 4 and second probe 5b is brought in contact with source electrode 16 of semiconductor element 1c in insulating liquid 4. Namely, gate electrode 27 is electrically connected to first probe 5a in insulating liquid 4, and source electrode 16 is electrically connected to second probe 5b in insulating liquid 4. Third probe 6 is electrically connected to drain electrode 20 through conductive stage 3. Then, a voltage for measuring a breakdown voltage is applied by voltage application portion 7 across second probe 5b and third probe 6. Namely, a voltage for measuring a breakdown voltage is applied across source electrode 16 and drain electrode 20. As necessary, the gate drive portion may apply a gate voltage to gate electrode 27.

In the step of measuring a breakdown voltage of a semiconductor element, for example, a drain current which flows between source electrode 16 and drain electrode 20 is measured with a current measurement portion (not shown) while a voltage applied to drain electrode 20 by voltage application portion 7 is increased with a potential of each of gate electrode 27 and source electrode 16 being set to 0 V, and a voltage applied across source electrode 16 and drain electrode 20 at the time when the drain current exceeds a prescribed reference value is determined as the breakdown voltage. As set forth above, after the step of dividing wafer 1 into a plurality of chips 2, a breakdown voltage of semiconductor element 1c is measured while probe 5b is in contact with source electrode 16 of semiconductor element 1c in insulating liquid 4 and third probe 6 is in contact with drain electrode 20. Preferably, a breakdown voltage of semiconductor element 1c is measured while insulating liquid 4 is arranged to cover the entire chip 2 on surface 3a of stage 3, probe 5b is in contact with source electrode 16 of semiconductor element 1c in insulating liquid 4, and third probe 6 is in contact with drain electrode 20.

Then, the step of removing insulating liquid 4 is performed. Preferably, insulating liquid 4 is removed from chip 2 by vaporizing insulating liquid 4 arranged on chip 2. Specifically, insulating liquid 4 is heated by heating surface 3a of stage 3 with a heating portion (not shown) provided in stage 3. Insulating liquid 4 is removed as insulating liquid 4 is vaporized as it is heated to a boiling point or higher of insulating liquid 4. For example, Fluorinert™ FC-72 of Sumitomo 3M Limited has a boiling point around 56° C. Insulating liquid 4 is effectively removed by heating surface 3a of stage 3, for example, to 60° C. or higher. From a point of view of effective removal of insulating liquid 4 from chip 2, a boiling point of insulating liquid 4 is preferably low. Insulating liquid 4 has a boiling point preferably not lower than 30° C. and not higher than 65° C.

Figure 8:
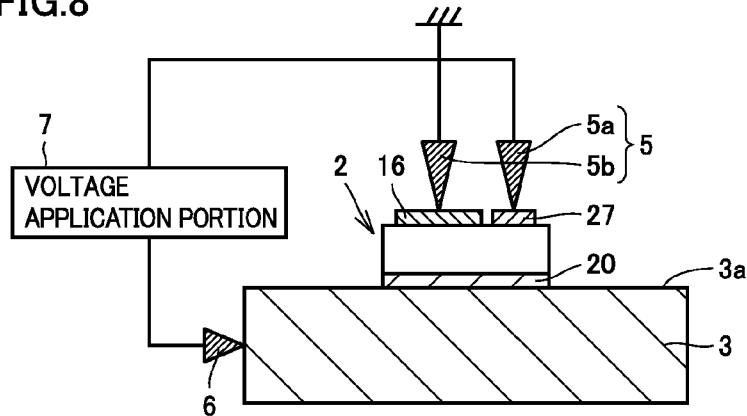
FIG. 8 is a vertical schematic cross-sectional view showing a sixth step in the method of measuring a breakdown voltage of a semiconductor element according to one embodiment of the present invention.

In the step of removing insulating liquid 4, insulating liquid 4 may be removed in such a manner that insulating liquid 4 is vaporized by being sprayed with an inert gas. The inert gas includes, for example, an argon gas, a nitrogen gas, or a helium gas. The inert gas may be sprayed to insulating liquid 4 while first probe 5a is in contact with gate electrode 27 and second probe 5b is in contact with source electrode 16. Preferably, the inert gas such as the nitrogen gas is sprayed to insulating liquid 4 while surface 3a of stage 3 is heated to a boiling point or higher of insulating liquid 4. Insulating liquid 4 may be removed by reducing a pressure in a space where chip 2 and stage 3 are arranged. Thus, insulating liquid 4 is removed from chip 2 in a shorter period of time (see FIG. 8). After insulating liquid 4 is removed from chip 2, chip 2 is unloaded from surface 3a of stage 3 and transition to the next step is made.

As set forth above, wafer 1 is diced into a plurality of chips 2 and a breakdown voltage of semiconductor element 1c is measured in a state of chip 2. Thus, whether or not semiconductor element 1c is a conforming or defective item is examined. Through the steps above, final semiconductor element 1c is manufactured. Namely, the method of manufacturing semiconductor element 1c has the method of measuring a breakdown voltage of semiconductor element 1c described above. A breakdown voltage of semiconductor element 1c may be measured in both of the state of wafer 1 and the state of chip 2. For example, a breakdown voltage of chip 2 corresponding to chip region 2a determined as a defective item in the state of wafer 1 is not measured in the state of chip 2, but a breakdown voltage only of chip 2 corresponding to chip region 2a determined as a conforming item in the state of wafer 1 may be measured in the state of chip 2. Namely, the step of measuring a breakdown voltage of semiconductor element 1c may have the step of measuring a breakdown voltage of semiconductor element 1c (the first breakdown voltage measurement step) and the step of measuring a breakdown voltage of semiconductor element 1c of chip 2 corresponding to chip region 2a determined as a conforming item in the first breakdown voltage measurement step (a second breakdown voltage measurement step) before division of wafer 1 into a plurality of chips 2.

A first modification of the method of measuring a breakdown voltage of a semiconductor element will now be described.

Figure 9:
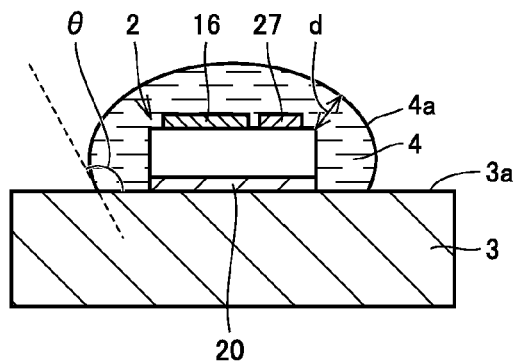
FIG. 9 is a vertical schematic cross-sectional view showing a first modification of the fourth step in the method of measuring a breakdown voltage of a semiconductor element according to one embodiment of the present invention.

Referring to FIG. 9, in the step of arranging insulating liquid 4 on chip 2, when viewed in a direction in parallel to surface 3a of stage 3, angle of contact θ formed between surface 3a of stage 3 and outer surface 4a of insulating liquid 4 is preferably not smaller than 90° and more preferably greater than 90°. In order to achieve angle of contact θ formed between surface 3a of stage 3 and outer surface 4a of insulating liquid 4 which is not smaller than 90°, roughness of surface 3a of stage 3 is desirably increased. Preferably, arithmetic mean roughness (Ra) of surface 3a of stage 3 is not smaller than 2 μm and not greater than 10 μm. In order to increase angle of contact θ, a part of the surface of chip 2 is desirably composed of a highly water-repellent material. A highly water-repellent material is exemplified by polyimide.

A second modification of the method of measuring a breakdown voltage of a semiconductor element will now be described.

Figure 10:
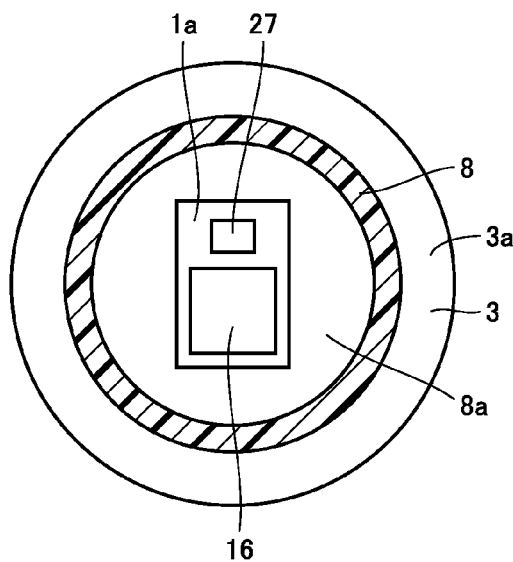
FIG. 10 is a lateral schematic cross-sectional view showing a second modification of the fourth step in the method of measuring a breakdown voltage of a semiconductor element according to one embodiment of the present invention.
Figure 11:
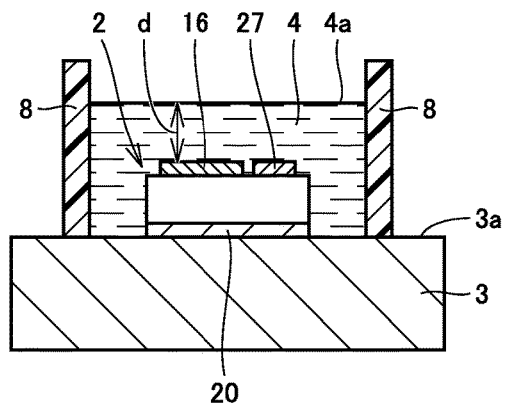
FIG. 11 is a vertical schematic cross-sectional view showing the second modification of the fourth step in the method of measuring a breakdown voltage of a semiconductor element according to one embodiment of the present invention.

Referring to FIG. 10, sidewall 8 may be provided to surround chip 2 on surface 3a of stage 3 when viewed in a direction perpendicular to surface 3a. Referring to FIG. 11, sidewall 8 is in contact with surface 3a of stage 3 and formed to extend in a direction perpendicular to surface 3a. Sidewall 8 is composed, for example, of a resin. Insulating liquid 4 is arranged in space 8a (see FIG. 10) formed by surface 3a of stage 3 and sidewall 8. Chip 2 may be arranged on surface 3a of stage 3 after insulating liquid 4 is arranged in space 8a formed by surface 3a of stage 3 and sidewall 8, or insulating liquid 4 may be arranged in space 8a after chip 2 is arranged in space 8a formed by surface 3a of stage 3 and sidewall 8. In the step of measuring a breakdown voltage of semiconductor element 1c, a breakdown voltage of semiconductor element 1c is measured while the entire chip 2 is immersed in insulating liquid 4 in space 8a.

A third modification of the method of measuring a breakdown voltage of a semiconductor element will now be described.

Figure 12:
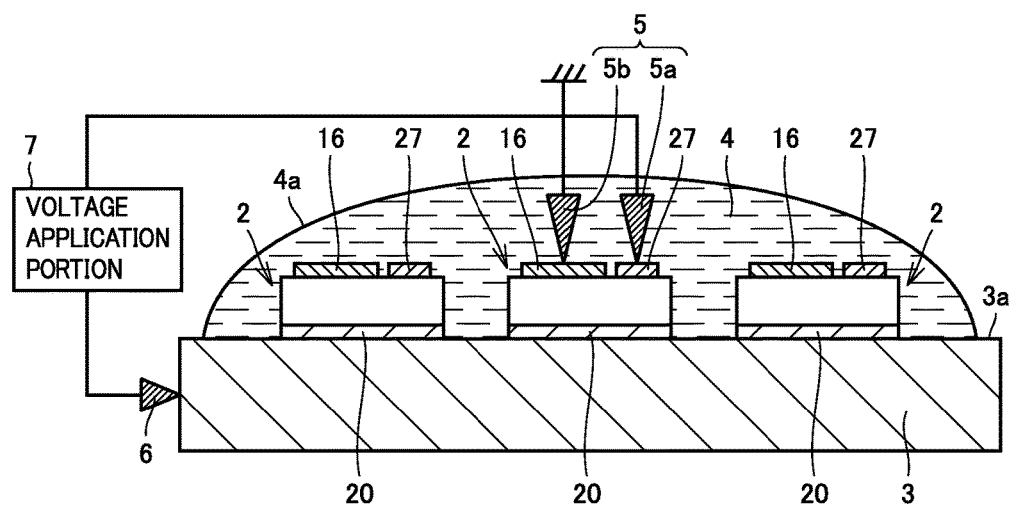
FIG. 12 is a vertical schematic cross-sectional view showing a third modification of the fifth step in the method of measuring a breakdown voltage of a semiconductor element according to one embodiment of the present invention.

Referring to FIG. 12, a plurality of chips 2 may be arranged on surface 3a of stage 3. For example, three chips 2 are arranged on surface 3a of stage 3 and insulating liquid 4 is arranged on surface 3a so as to cover the entire three chips 2. Insulating liquid 4 may be arranged also between two adjacent chips 2. Third probe 6 is electrically connected to stage 3 shared by three chips 2. In the step of measuring a breakdown voltage of a semiconductor element, for example, first probe 5a is connected to gate electrode 27 of first chip 2 arranged in the center in FIG. 12 and second probe 5b is connected to source electrode 16. A breakdown voltage of first chip 2 is measured by applying a voltage for measuring a breakdown voltage across source electrode 16 and drain electrode 20 of first chip 2. Then, first probe 5a is connected to gate electrode 27 of a second chip (a chip arranged on the right in FIG. 12) different from first chip 2 and second probe 5b is connected to source electrode 16. A breakdown voltage of second chip 2 is measured by applying a voltage for measuring a breakdown voltage across source electrode 16 and drain electrode 20 of second chip 2. As set forth above, a breakdown voltage of each of the plurality of chips 2 may successively be measured with the plurality of chips 2 being mounted on the same surface 3a of stage 3.

Though a case that semiconductor layer 10 contains silicon carbide has been described in the embodiment above, it may contain a material other than silicon carbide, such as silicon. Preferably, semiconductor layer 10 is composed of a wide band gap semiconductor greater in band gap than silicon. The wide band gap semiconductor includes, for example, gallium nitride or diamond.

Though a case that second probe 5b is connected to source electrode 16 in insulating liquid 4 after insulating liquid 4 is applied onto chip 2 has been described in the embodiment above, insulating liquid 4 may be applied onto chip 2 after second probe 5b is connected to source electrode 16.

Though description has been given in the embodiment above with the n-type being defined as the first conductivity type and the p-type being defined as the second conductivity type, the p-type may be defined as the first conductivity type and the n-type may be defined as the second conductivity type. Though a MOSFET has been described by way of example of a semiconductor element, the semiconductor element may be a diode, an insulated gate bipolar transistor (IGBT), and a junction field effect transistor (JFET).

A function and effect of the method of measuring a breakdown voltage of a semiconductor element according to the present embodiment will now be described.

According to the method of measuring a breakdown voltage of semiconductor element $1c$ in the present embodiment, after wafer 1 is divided into a plurality of chips 2, a breakdown voltage of semiconductor element $1c$ is measured while probe $5b$ is in contact with electrode 16 of semiconductor element $1c$ in insulating liquid 4. Therefore, a breakdown voltage of semiconductor element $1c$ in the state of chip 2 close to the final product can accurately be measured.

According to the method of measuring a breakdown voltage of semiconductor element $1c$ in the present embodiment, the step of measuring a breakdown voltage of semiconductor element $1c$ includes the step of arranging chip 2 on surface $3a$ of stage 3. In the step of measuring a breakdown voltage of semiconductor element $1c$, a breakdown voltage of semiconductor element $1c$ is measured while insulating liquid 4 is arranged to cover the entire chip 2 on surface $3a$. Thus, occurrence of atmospheric discharge in probe $5b$ can effectively be prevented.

According to the method of measuring a breakdown voltage of semiconductor element $1c$ in the present embodiment, on surface $3a$ of stage 3, when viewed in a direction perpendicular to surface $3a$, sidewall 8 is provided to surround chip 2. Insulating liquid 4 is arranged in space $8a$ formed by surface $3a$ and sidewall 8. In the step of measuring a breakdown voltage of semiconductor element $1c$, a breakdown voltage of semiconductor element $1c$ is measured while the entire chip 2 is immersed in insulating liquid 4 in space $8a$. Thus, since an amount of insulating liquid 4 is maintained constant, reproducibility of a result of measurement of a breakdown voltage of semiconductor element $1c$ is improved.

According to the method of measuring a breakdown voltage of semiconductor element $1c$ in the present embodiment, surface $3a$ of stage 3 has arithmetic mean roughness not greater than 2.0 μm. Thus, a desired height of insulating liquid 4 from an upper surface of chip 2 can be held.

According to the method of measuring a breakdown voltage of semiconductor element $1c$ in the present embodiment, when viewed in a direction in parallel to surface $3a$ of stage 3, angle of contact θ formed between surface $3a$ of stage 3 and outer surface $4a$ of insulating liquid 4 is not smaller than 90°. Thus, a breakdown voltage of semiconductor element $1c$ can be measured with an amount of insulating liquid smaller than in a case that angle of contact θ is smaller than 90°.

The method of measuring a breakdown voltage of semiconductor element $1c$ according to the present embodiment further includes the step of removing insulating liquid 4 after the step of measuring a breakdown voltage of semiconductor element $1c$. When chip 2 is immersed in insulating liquid 4, it becomes difficult to handle chip 2 after a breakdown voltage of semiconductor element $1c$ is measured. With the step of removing insulating liquid 4 after the step of measuring a breakdown voltage of semiconductor element $1c$, handling of chip 2 can be facilitated.

According to the method of measuring a breakdown voltage of semiconductor element $1c$ in the present embodiment, the step of removing insulating liquid 4 includes the step of heating insulating liquid 4 to a temperature not lower than a boiling point of insulating liquid 4. Thus, insulating liquid 4 can effectively be removed.

According to the method of measuring a breakdown voltage of semiconductor element $1c$ in the present embodiment, the step of removing insulating liquid 4 includes the step of spraying an inert gas to insulating liquid 4. Thus, insulating liquid 4 can effectively be removed.

According to the method of measuring a breakdown voltage of semiconductor element $1c$ in the present embodiment, a portion of insulating liquid 4 smallest in thickness on the outer surface of chip 2 has thickness d not smaller than 200 μm. Thus, occurrence of atmospheric discharge in probe $5b$ can effectively be prevented.

According to the method of measuring a breakdown voltage of semiconductor element $1c$ in the present embodiment, semiconductor element $1c$ contains a silicon carbide semiconductor. Semiconductor element $1c$ containing the silicon carbide semiconductor is higher in breakdown voltage than a semiconductor element containing silicon. The method of measuring a breakdown voltage of semiconductor element $1c$ according to the present embodiment is more suitably made use of for semiconductor element $1c$ high in breakdown voltage.

According to the method of manufacturing semiconductor element $1c$ in the present embodiment, a method of manufacturing semiconductor element $1c$ having the step of measuring a breakdown voltage high in accuracy in measurement of a breakdown voltage of semiconductor element $1c$ can be provided.

Though the embodiment of the present invention has been described, it should be understood that the embodiment disclosed herein is illustrative and non-restrictive in every respect. The scope of the present invention is defined by the terms of the claims and is intended to include any modifications within the scope and meaning equivalent to the terms of the claims.

What is claimed is:

1. A method of measuring a breakdown voltage of a semiconductor element, comprising the steps of:
    preparing a wafer provided with a plurality of semiconductor elements each having an electrode;
    dividing said wafer into a plurality of chips provided with at least one said semiconductor element; and
    measuring a breakdown voltage of said semiconductor element while a probe is in contact with said electrode of said semiconductor element in an insulating liquid after the step of dividing said wafer into a plurality of said chips,
    wherein a portion of said insulating liquid smallest in thickness on an outer surface of said chip has a thickness not smaller than 200 μm.

2. The method of measuring a breakdown voltage of a semiconductor element according to claim 1, wherein
    said step of measuring a breakdown voltage of said semiconductor element includes the step of arranging said chip on a surface of a stage, and
    in said step of measuring a breakdown voltage of said semiconductor element, a breakdown voltage of said semiconductor element is measured while said insulating liquid is arranged to cover the entire chip on said surface.

3. The method of measuring a breakdown voltage of a semiconductor element according to claim 2, wherein
    on said surface of said stage, when viewed in a direction perpendicular to said surface, a sidewall is provided to surround said chip, said insulating liquid is arranged in a space formed by said surface and said sidewall, and in said step of measuring a breakdown voltage of said semiconductor element, a breakdown voltage of said semiconductor element is measured while the entire chip is immersed in said insulating liquid in said space.

4. The method of measuring a breakdown voltage of a semiconductor element according to claim 2, wherein said surface of said stage has arithmetic mean roughness not greater than 2.0 µm.

5. The method of measuring a breakdown voltage of a semiconductor element according to claim 2, wherein when viewed in a direction in parallel to said surface of said stage, an angle of contact formed between said surface of said stage and an outer surface of said insulating liquid is not smaller than 90°.

6. The method of measuring a breakdown voltage of a semiconductor element according to claim 1, further comprising the step of removing said insulating liquid after said step of measuring a breakdown voltage of said semiconductor element.

7. The method of measuring a breakdown voltage of a semiconductor element according to claim 6, wherein said step of removing said insulating liquid includes the step of heating said insulating liquid to a temperature not lower than a boiling point of said insulating liquid.

8. The method of measuring a breakdown voltage of a semiconductor element according to claim 6, wherein said step of removing said insulating liquid includes the step of spraying an inert gas to said insulating liquid.

9. The method of measuring a breakdown voltage of a semiconductor element according to claim 1, wherein said semiconductor element contains a silicon carbide semiconductor.

10. A method of manufacturing a semiconductor element, comprising the method of measuring a breakdown voltage of a semiconductor element according to claim 1.

* * * * *